US011362079B2

(12) United States Patent
Wu et al.

(10) Patent No.: US 11,362,079 B2
(45) Date of Patent: Jun. 14, 2022

(54) BONDED DIE ASSEMBLY CONTAINING A MANGANESE-CONTAINING OXIDE BONDING LAYER AND METHODS FOR MAKING THE SAME

(71) Applicant: SANDISK TECHNOLOGIES LLC, Addison, TX (US)

(72) Inventors: Chen Wu, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 65 days.

(21) Appl. No.: 16/440,183

(22) Filed: Jun. 13, 2019

(65) Prior Publication Data
US 2020/0395350 A1 Dec. 17, 2020

(51) Int. Cl.
*H01L 25/18* (2006.01)
*H01L 23/48* (2006.01)
(Continued)

(52) U.S. Cl.
CPC ............ *H01L 25/18* (2013.01); *H01L 21/304* (2013.01); *H01L 21/30608* (2013.01); *H01L 21/76224* (2013.01); *H01L 21/76898* (2013.01); *H01L 23/481* (2013.01); *H01L 23/5283* (2013.01); *H01L 24/29* (2013.01); *H01L 24/32* (2013.01);
(Continued)

(58) Field of Classification Search
CPC ...................................................... H01L 25/50
See application file for complete search history.

(56) References Cited

U.S. PATENT DOCUMENTS 8,324,730 B2   12/2012   Koike et al.
8,674,515 B2   3/2014    Farooq et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Walter H Swanson
(74) *Attorney, Agent, or Firm* — The Marbury Law Group PLLC

(57) ABSTRACT

A method of forming a bonded assembly includes providing a first semiconductor die containing a first substrate, first semiconductor devices, first dielectric material layers overlying the first semiconductor devices, and first metal interconnect structures, providing a second semiconductor die containing a second substrate, second semiconductor devices, second dielectric material layers overlying the second semiconductor devices, and second metal interconnect structures, depositing a manganese layer on a top surface of the first dielectric material layers, disposing the second semiconductor die on the manganese layer such that a surface of the second dielectric material layers contacts the manganese layer, and performing a bonding anneal to bond the first semiconductor die to the second semiconductor die and to convert the manganese layer into a manganese-containing oxide layer, such that the manganese-containing oxide layer is bonded to the first dielectric material layers and the second dielectric material layers.

13 Claims, 11 Drawing Sheets

(51) Int. Cl.
   H01L 23/00    (2006.01)
   H01L 25/00    (2006.01)
   H01L 23/528   (2006.01)
   H01L 21/762   (2006.01)
   H01L 21/304   (2006.01)
   H01L 21/306   (2006.01)
   H01L 21/768   (2006.01)
   H01L 27/11551 (2017.01)

(52) U.S. Cl.
   CPC .............. *H01L 24/83* (2013.01); *H01L 25/50* (2013.01); *H01L 27/11551* (2013.01); *H01L 2224/29149* (2013.01); *H01L 2224/325* (2013.01); *H01L 2224/32145* (2013.01); *H01L 2224/83055* (2013.01); *H01L 2224/83203* (2013.01); *H01L 2224/83931* (2013.01)

(56) References Cited

U.S. PATENT DOCUMENTS

| | | | |
|---|---|---|---|
| 9,620,479 | B1 | 4/2017 | Edelstein et al. |
| 9,716,088 | B1 | 7/2017 | Edelstein et al. |
| 10,283,493 | B1 | 5/2019 | Nishida |
| 2006/0035450 | A1 | 2/2006 | Frank et al. |
| 2014/0353828 | A1* | 12/2014 | Edelstein ............ H01L 23/5329 257/751 |
| 2016/0079164 | A1 | 3/2016 | Fukuzumi et al. |
| 2016/0181150 | A1 | 6/2016 | Liu et al. |
| 2017/0186665 | A1* | 6/2017 | Choudhury ............. H01L 24/27 |

OTHER PUBLICATIONS

S. Kim et al., "Permanent Wafer Bonding in the Low Temperature by Using Various Plasma Enhanced Chemical Vapor Deposition Dielectrics," 2015 International 3D Systems Integration Conference (3DIC), Sendai, 2015, pp. TS7.2.1-TS7.2.4. 4 pages.
L. Peng et al., "Advances in SiCN-SiCN Bonding with High Accuracy Wafer-to-Wafer (W2W) Stacking Technology," 2018 IEEE International Interconnect Technology Conference (IITC), Santa Clara, CA, 2018, pp. 179-181.
F. Inoue et al., "Influence of Composition of SiCN Film for Surface Activated Bonding," ECS Transactions, 86 (5) 159-168 (2018).
R. Gordon et al.,"Chemical Vapor Deposition (CVD) of Manganese Self-Aligned Diffusion Barriers for Cu Interconnections in Microelectronics", Advanced Metallization Conference 2008, available online from Harvard Library at http://nrs.harvard.edu/urn-3:HUL. InstRepos:3347575 (10 pages).
T. Plach et al., "Mechanisms for room temperature direct wafer bonding", Journal of Applied Physics 113, 094905 (2013) 8 pages.
Y. Otsuke et al.,"Graded composition and valence states in self-forming barrier layers at Cu—Mn /SiO 2 interface", Applied Physics Letters 96, 012101 (2010) 4 pages.
J. Koike et al., "Self-forming diffusion barrier layer in Cu—Mn alloy metallization", Applied Physics Letters 87, 041911 (2005) 4 pages.
J.M. Ablett et al., "Phase identification of self-forming Cu—Mn based diffusion barriers on p-SiOC : H and SiO 2 dielectrics using x-ray absorption fine structure", Applied Physics Letters 94, 042112 (2009) 4 pages.
J. Koike et al.,"Growth kinetics and thermal stability of a self-formed barrier layer at Cu—Mn/SiO 2 Interface", Journal of Applied Physics 102, 043527 (2007) 8 pages.
N. Phuong et al.,"Effects of Adsorbed Moisture in SiO2 Substrates on the Formation of a Mn Oxide Layer by Chemical Vapor Deposition", Journal of Physical Chemistry C (2011), 115, 16731-36.

U.S. Appl. No. 15/892,648, filed Feb. 9, 2018, Sandisk Technologies LLC.
U.S. Appl. No. 15/928,340, filed Mar. 22, 2018, Sandisk Technologies LLC.
U.S. Appl. No. 15/928,407, filed Mar. 22, 2018, Sandisk Technologies LLC.
U.S. Appl. No. 15/960,267, filed Apr. 23, 2018, Sandisk Technologies LLC.
U.S. Appl. No. 15/979,885, filed May 15, 2018, Sandisk Technologies LLC.
U.S. Appl. No. 16/231,752, filed Dec. 24, 2018, Sandisk Technologies LLC.
U.S. Appl. No. 16/242,216, filed Jan. 8, 2019, Sandisk Technologies LLC.
U.S. Appl. No. 16/243,469, filed Jan. 9, 2019, Sandisk Technologies LLC.
U.S. Appl. No. 16/248,923, filed Jan. 16, 2019, Sandisk Technologies LLC.
U.S. Appl. No. 16/249,423, filed Jan. 16, 2019, Sandisk Technologies LLC.
U.S. Appl. No. 16/255,413, filed Jan. 23, 2019, Sandisk Technologies LLC.
U.S. Appl. No. 16/269,301, filed Feb. 6, 2019, Sandisk Technologies LLC.
U.S. Appl. No. 16/274,687, filed Feb. 13, 2019, Sandisk Technologies LLC.
U.S. Appl. No. 16/275,668, filed Feb. 14, 2019, Sandisk Technologies LLC.
U.S. Appl. No. 16/278,372, filed Feb. 18, 2019, Sandisk Technologies LLC.
U.S. Appl. No. 16/284,502, filed Feb. 25, 2019, Sandisk Technologies LLC.
U.S. Appl. No. 16/288,656, filed Feb. 28, 2019, Sandisk Technologies LLC.
U.S. Appl. No. 16/291,457, filed Mar. 4, 2019, Sandisk Technologies LLC.
U.S. Appl. No. 16/291,504, filed Mar. 4, 2019, Sandisk Technologies LLC.
U.S. Appl. No. 16/291,577, filed Mar. 4, 2019, Sandisk Technologies LLC.
U.S. Appl. No. 16/295,292, filed Mar. 7, 2019, Sandisk Technologies LLC.
U.S. Appl. No. 16/372,908, filed Apr. 2, 2019, Sandisk Technologies LLC.
U.S. Appl. No. 16/385,010, filed Apr. 16, 2019, Sandisk Technologies LLC.
U.S. Appl. No. 16/417,913, filed May 21, 2019, Sandisk Technologies LLC.
U.S. Appl. No. 16/409,593, filed May 10, 2019, Sandisk Technologies LLC.
Notification of Transmittal of the International Search Report and Written Opinion of the International Search Authority for International Patent Application No. PCT/US2019/068868, dated Apr. 7, 2020, 17 pages.
Gordon, R.G. et al., "Chemical vapor deposition (CVD) of manganese self-aligned diffusion barriers for Cu Interconnections in microelectronics," In Advanced Metallization Conference 2008 (AMC 2008): Proceedings of the conference: Sep. 23-25, 2008, San Diego, California, U.S.A, and Oct. 8-10, 2008, at the University of Tokyo, Tokyo, Japan. Materials Research Society conference proceedings. Warrendale, Pa: Materials Research Society.
Dixit, V. K. et al., "Structural and Electronic Properties of a Mn Oxide Diffusion Barrier Layer Formed by Chemical Vapor Deposition," IEEE Transactions on Device and Materials Reliability, vol. 11, No. 2, pp. 295-302, Jun. 2011.

* cited by examiner

BONDED DIE ASSEMBLY CONTAINING A MANGANESE-CONTAINING OXIDE BONDING LAYER AND METHODS FOR MAKING THE SAME

FIELD

The present disclosure relates generally to the field of semiconductor devices, and particularly to a bonded die assembly containing a manganese-containing oxide bonding layer and methods for making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly comprises a first semiconductor die comprising a first substrate, first semiconductor devices overlying the first substrate, first dielectric material layers overlying the first semiconductor devices, and first metal interconnect structures embedded in the first dielectric material layers, a second semiconductor die overlying the first semiconductor die, and comprising a second substrate, second semiconductor devices overlying second substrate, second dielectric material layers overlying the second semiconductor devices, and second metal interconnect structures embedded in the second dielectric material layers, and a manganese-containing oxide layer contacting a top surface of the first dielectric material layers and a bottom surface of the second dielectric material layers.

According to another embodiment of the present disclosure, a method of forming a bonded assembly includes providing a first semiconductor die containing a first substrate, first semiconductor devices overlying the first substrate, first dielectric material layers overlying the first semiconductor devices, and first metal interconnect structures embedded in the first dielectric material layers, providing a second semiconductor die containing a second substrate, second semiconductor devices overlying the second substrate, second dielectric material layers overlying the second semiconductor devices, and second metal interconnect structures embedded in the second dielectric material layers, depositing a manganese layer on a top surface of the first dielectric material layers, disposing the second semiconductor die on the manganese layer such that a surface of the second dielectric material layers contacts the manganese layer, and performing a bonding anneal to bond the first semiconductor die to the second semiconductor die and to convert the manganese layer into a manganese-containing oxide layer, such that the manganese-containing oxide layer is bonded to the first dielectric material layers and the second dielectric material layers.

DETAILED DESCRIPTION

Figure 1:
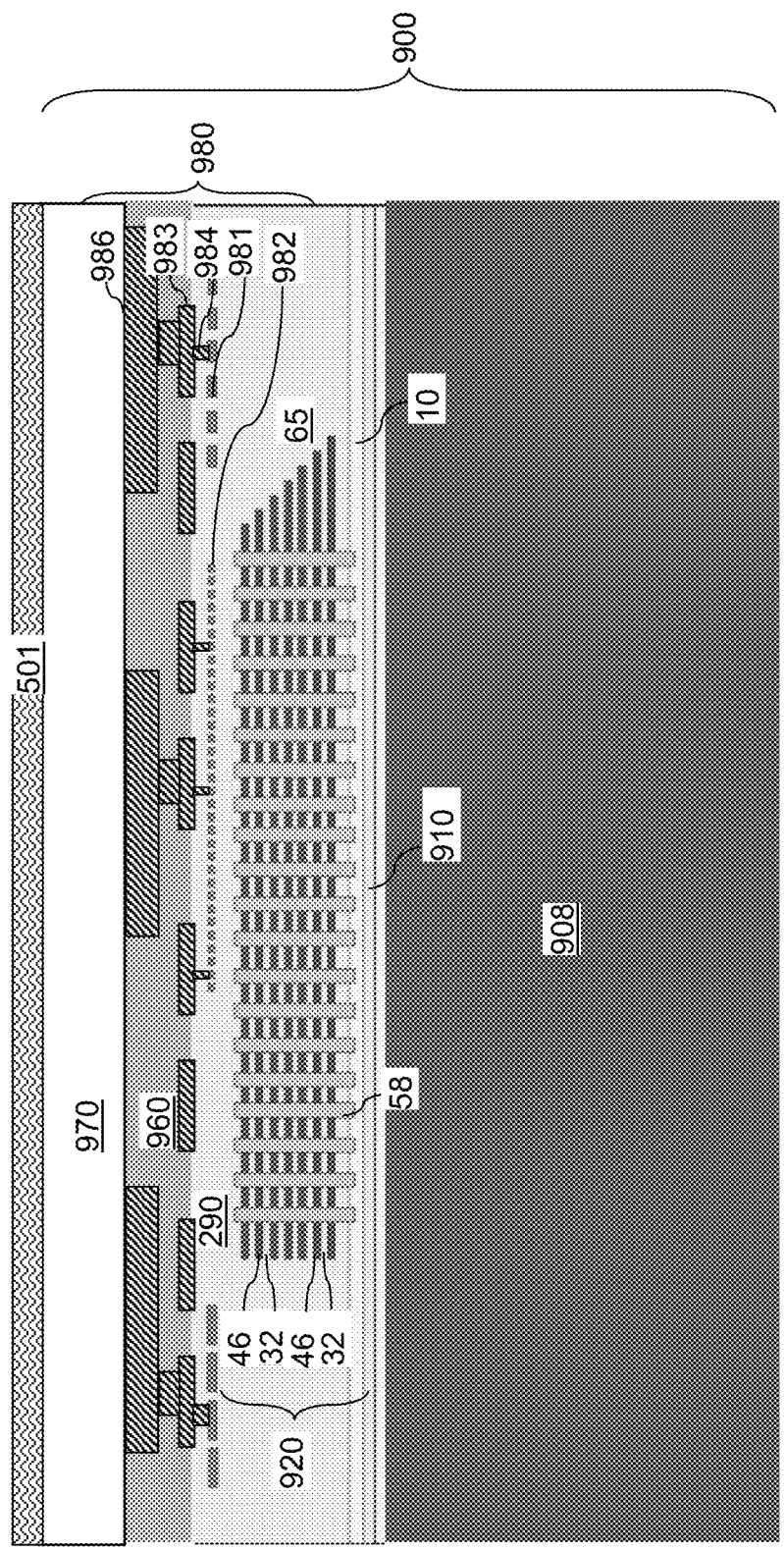
FIG. 1 is a schematic vertical cross-sectional view of a first semiconductor die after formation of a manganese layer thereupon according to a first embodiment of the present disclosure.

High performance semiconductor chips may be provided by using a wafer bonding between a first wafer including memory dies and a second wafer including support dies, which are dies including logic devices configured to operate a respective one of the memory dies. The dies may be bonded using wafer-to-wafer bonding, which utilizes chemical bond formation between pad dielectric material layers of opposing wafers. The pad dielectric material layers are planarized to provide flat surfaces to provide effective bonding between the two wafers. The planarization process can be costly and time-consuming. One embodiment of the present disclosure provides a cost-effective and simple bonding process that does not require preparation of bonding surfaces with a high degree of planarity by using a manganese-containing oxide bonding layer, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to a first embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 can comprise any semiconductor device known in the art. In one embodiment, the first semiconductor die 900 comprises a memory die, and may include a memory device, such as a three dimensional NAND memory device. In an illustrative example, the first semiconductor devices 920 can include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 can be formed within each memory opening. A memory opening fill structure 58 can include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 can include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) can include first contact-level dielectric layers 290 embedding contact via structures 981 and bit lines 982, first interconnect-level dielectric layers 960 that embed a subset (983, 984) of the first metal interconnect structures 980 located above the first contact-level dielectric layers 290, and a first bonding-level silicon oxide layer 970 that is formed above the first interconnect-level dielectric layer 960. The contact via structures contact various nodes of the first semiconductor devices. The bit lines 982 can contact a subset of the contact via structures (not shown for clarity) that are connected to the vertical semiconductor channels. Interconnect metal lines 983 and interconnect metal via structures 984, which are a subset of the first metal interconnect structures 980 can be embedded in the first interconnect-level dielectric layers 960. The first metal interconnect structures 980 also include first metallic pad structures 986 located within an upper portion of the first interconnect-level dielectric layers 960 or located within a lower portion of the first bonding-level silicon oxide layer 970. The first metallic pad structures 986 are located below the horizontal plane including the top surface of the first bonding-level silicon oxide layer 970.

Each of the first contact-level dielectric layers 290 and the first interconnect-level dielectric layers 960 can include a dielectric material such as undoped silicate glass, a doped silicate glass, organosilicate glass, silicon nitride, a dielectric metal oxide, or a combination thereof. The first bonding-level silicon oxide layer 970 includes a silicon oxide material, such as undoped silicon dioxide or doped silicon oxide, such as a low-k dielectric comprising carbon and/or hydrogen doped silicon oxide ("SiOCH"). The thickness of the first bonding-level silicon oxide layer 970 can be in a range from 100 nm to 3,000 nm, although lesser and greater thicknesses can also be employed. The first bonding-level silicon oxide layer 970 can have a planar top surface, which can be provided, for example, by a planarization process such as a chemical mechanical polishing (CMP) process.

According to an aspect of the present disclosure, a manganese layer 501 can be deposited on a top surface of the first dielectric material layers (290, 960, 970), which can be the top surface of the bonding-level silicon oxide layer 970. In one embodiment, the manganese layer 501 can consist essentially of manganese. In another embodiment, the manganese layer 501 can include 0 to 10 weight percent of one or more alloying elements, such as molybdenum, cobalt, oxygen, nitrogen, etc. Alternatively, the manganese layer 501 may comprise a manganese nitride layer which is subsequently oxidized to form a manganese-containing oxide layer. In one embodiment, the manganese layer 501 can have a thickness in a range from 2 nm to 15 nm, such as from 5 nm to 10 nm, upon deposition. The manganese layer 501 can be formed by physical vapor deposition (PVD) or chemical vapor deposition (CVD).

Figure 2:
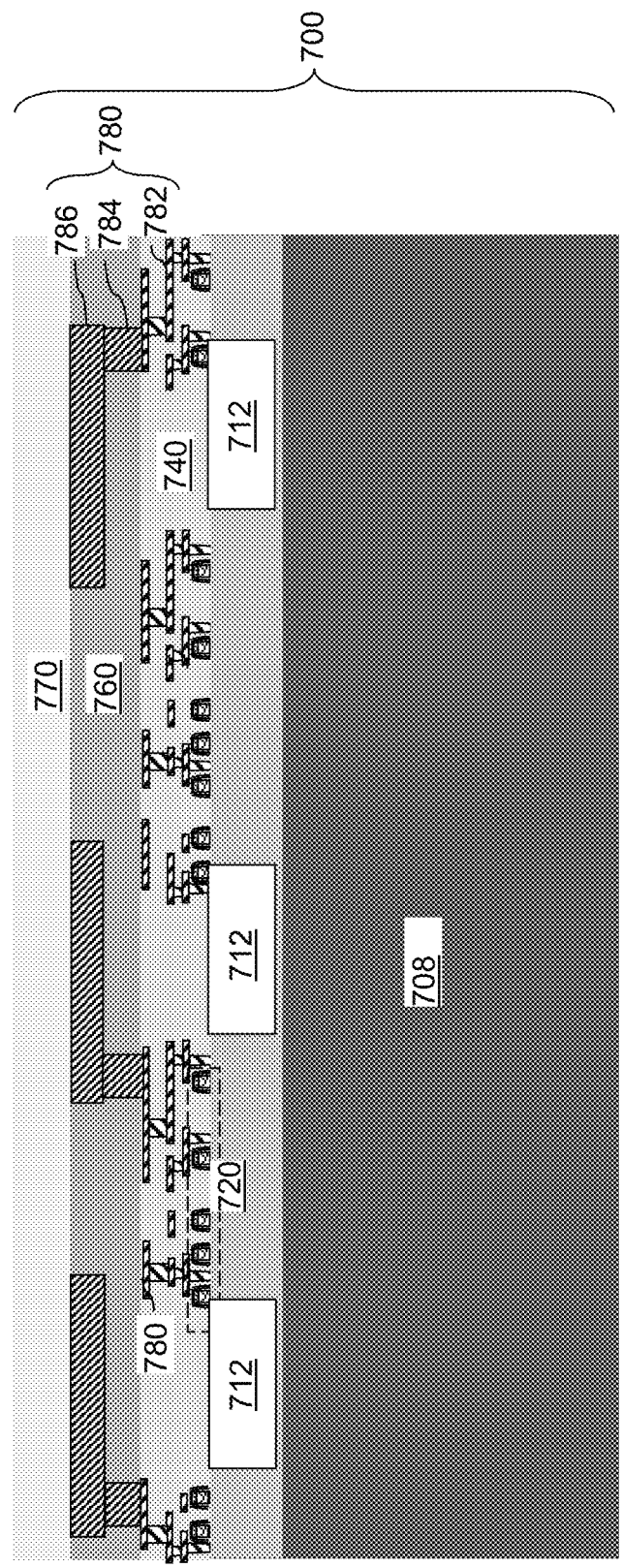
FIG. 2 is a schematic vertical cross-sectional view of a second semiconductor die according to the first embodiment of the present disclosure.

Referring to FIG. 2, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon wafer having a thickness in a range from 500 microns to 1 mm. Optional substrate isolation dielectric structures 712 may be formed in an upper portion of the second substrate 708, for example, by forming trenches and filling the trenches with a dielectric material, such as silicon oxide. In one embodiment, the pattern of the substrate isolation dielectric structures 712 may have a pattern that is the same as, or similar to, a mirror image pattern of the pattern of the first metallic pad structures 986. The thickness of the substrate isolation dielectric structures 712 can be in a range from 0.5 micron to 3 microns, although lesser and greater thicknesses can also be employed.

Generally, the second semiconductor devices can comprise any semiconductor device that can be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support (e.g., peripheral) circuitry for operation of memory devices within the memory die. In one embodiment, the first semiconductor die 900 can include a three-dimensional NAND memory device including a three-dimensional array of memory elements 58, word lines 46 and bit lines 982, the second semiconductor devices 720 of the second semiconductor die 700 can include a peripheral circuitry for operation of the three-dimensional array of memory elements. The peripheral circuitry may include a word line driver that drives word lines of the three-dimensional array of memory elements within the first semiconductor die 900, a bit line driver that drives the bit lines 982 in the first semiconductor die 900, a word line decoder circuit that decodes the addresses for the electrically conductive layers 46, a bit line decoder circuit that decodes the addresses for the bit lines 982, a sense amplifier circuit that senses the states of memory elements within the memory opening fill structures 58 in the first semiconductor die 900, a source power supply circuit that provides power to the horizontal semiconductor channel layer 10 in the first semiconductor die 900, a data buffer and/or latch, or any other semiconductor circuit that may be used to operate three-dimensional array of memory elements in the first semiconductor die 900.

The second dielectric material layers (740, 760, 770) can include proximal interconnect-level dielectric layers 740 embedding a proximal subset 782 of the second metal interconnect structures 780 that is proximal to the second substrate 708, distal interconnect-level dielectric layers 760 embedding a distal subset 784 of second metal interconnect structures 780 that is distal from the second substrate 708, and a second bonding-level silicon oxide layer 770 that is formed above the distal interconnect-level dielectric layers 760. The second metal interconnect structures 780 include second metallic pad structures 786 located within an upper portion of the distal interconnect-level dielectric layers 760 or located within a lower portion of the second bonding-level silicon oxide layer 770. The second metallic pad structures 786 are located below the horizontal plane including the top surface of the second bonding-level silicon oxide layer 770. In one embodiment, the pattern of the second metallic pad structures 786 can be a mirror image of the pattern of the first metallic pad structures 986. In one embodiment, each second metallic pad structure 786 can overlie a substrate isolation dielectric structure 712.

The proximal interconnect-level dielectric layers 740 and the distal interconnect-level dielectric layers 760 can include a dielectric material such as undoped silicate glass, a doped silicate glass, organosilicate glass, silicon nitride, a dielectric metal oxide, or a combination thereof. The second bonding-level silicon oxide layer 770 includes a silicon oxide material, such as undoped silicon dioxide or doped silicon oxide, such as a low-k dielectric comprising carbon and/or hydrogen doped silicon oxide ("SiOCH"). The thickness of the second bonding-level silicon oxide layer 770 can be in a range from 100 nm to 3,000 nm, although lesser and greater thicknesses can also be employed. The second bonding-level silicon oxide layer 770 can have a planar top surface, which can be provided, for example, by a planarization process such as a chemical mechanical polishing (CMP) process.

Figure 3:
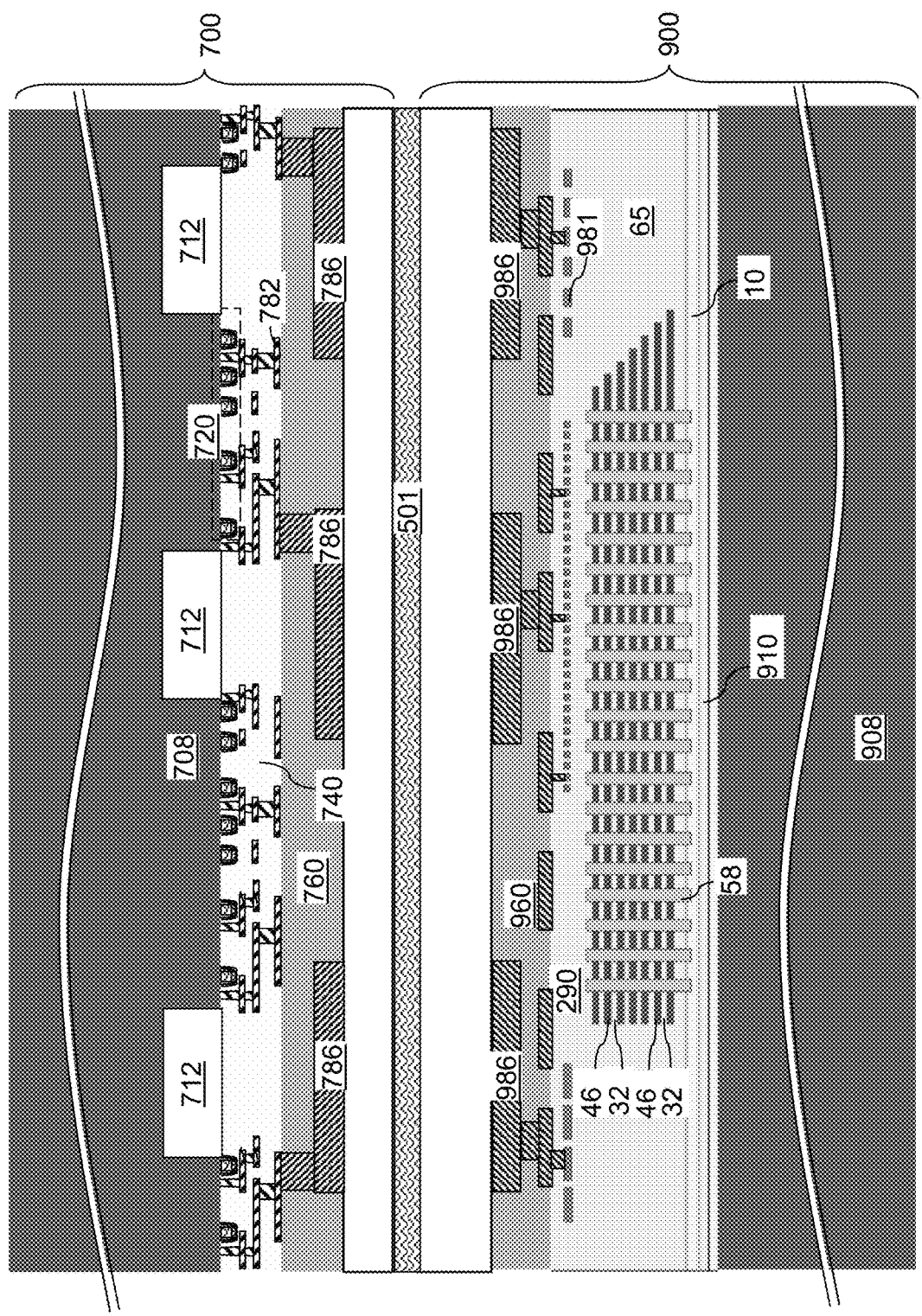
FIG. 3 is a schematic vertical cross-sectional view of a first exemplary structure including the first semiconductor die, the second semiconductor die, and the manganese layer disposed between the first semiconductor die and the second semiconductor die according to the first embodiment of the present disclosure.

Referring to FIG. 3, the first semiconductor die 900 and the second semiconductor die 700 are oriented such that the manganese layer 501 faces the second bonding-level silicon oxide layer 770. The second semiconductor die 700 can be disposed on the manganese layer 501 such that a surface of the second dielectric material layers (740, 760, 770) (such as a surface of the second bonding-level silicon oxide layer 770) contacts the manganese layer 501. In an alternative embodiment, the manganese layer 501 is formed on the second semiconductor die 700, such as over the second bonding-level silicon oxide layer 770. In this alternative embodiment, the first semiconductor die 900 can be disposed on the manganese layer 501 such that a surface of the first dielectric material layers (such as a surface of the first bonding-level silicon oxide layer 970) contacts the manganese layer 501.

Figure 4:
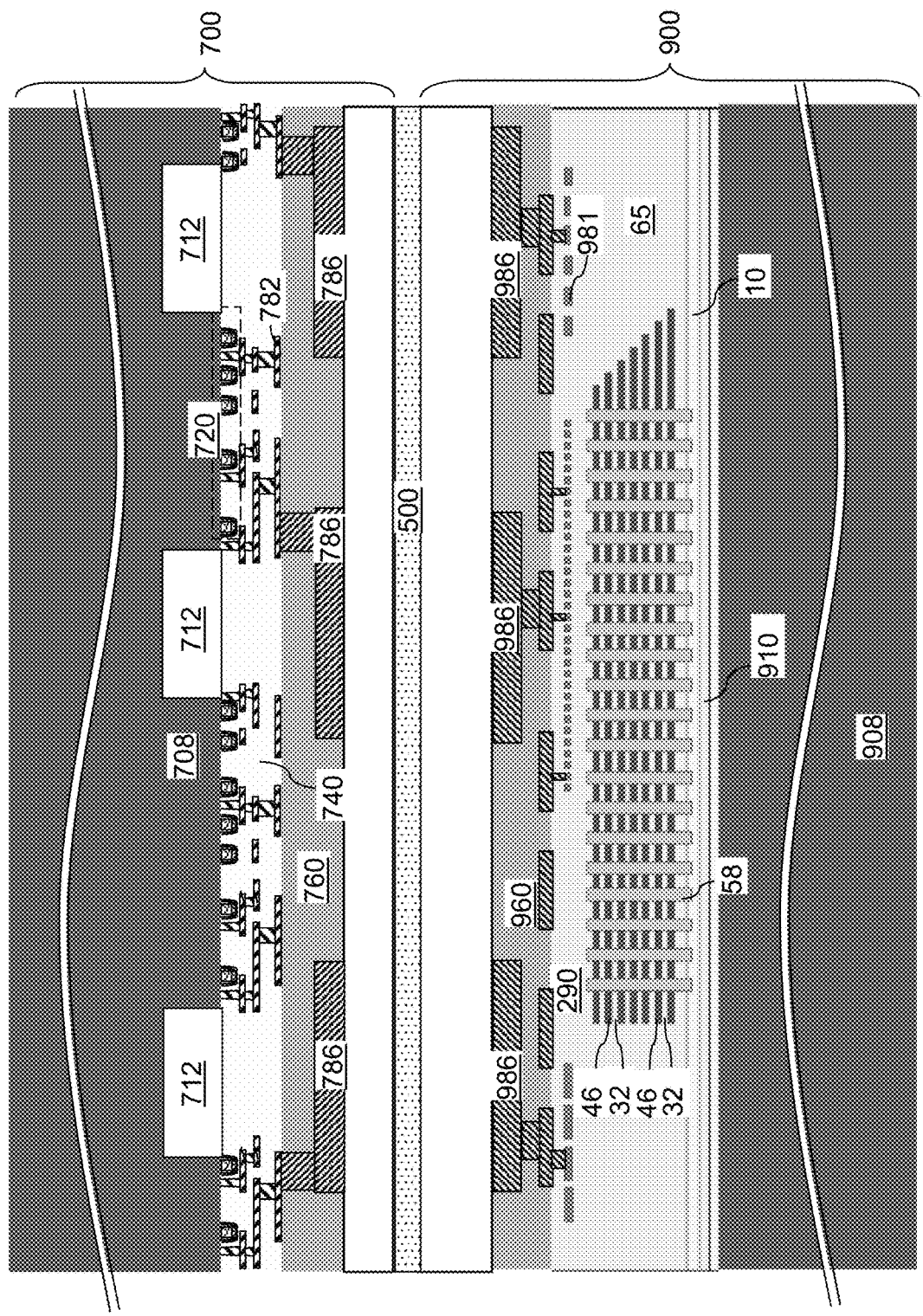
FIG. 4 is a schematic vertical cross-sectional view of the first exemplary structure after conversion of the manganese layer into a manganese-containing oxide layer according to the first embodiment of the present disclosure.

Referring to FIG. 4, the manganese layer 501 can be converted into a manganese-containing oxide layer 500 through conversion of the manganese in the manganese layer 501 into a manganese-containing oxide material in an oxidation process during the bonding anneal. As used herein, a manganese-containing oxide material refers to a dielectric material that contains at least 30 atomic percent ("at. %") manganese, such as 35 to 55 at. % Mn, for example 40 to 50 at. % Mn, and at least 40 at. % oxygen, such as 45 to 75 at. % oxygen for example 40 to 60 at. % oxygen.

The oxidation process may be a thermal oxidation process performed at a temperature of at least 200° C., such as 250 to 550° C., for example 300 to 450° C., for 20 minutes to 24 hours, for example 30 minutes to 1 hour while the first semiconductor die 900 and the second semiconductor die 700 are pressed against the manganese layer 501. The oxidation process may optionally be performed in oxidizing ambient, which can include air, $O_2$, $NO_2$, and/or $H_2O$ as an oxidizing agent. The oxidation process induces diffusion of oxygen atoms and optionally silicon atoms from the silicon oxide materials of the first bonding-level silicon oxide layer 970 and the second bonding-level silicon oxide layer 770 into the manganese layer 501. Further, additional oxygen atoms can optionally be provided from the oxidizing ambient into peripheral portions of the manganese layer 501. The thickness of the manganese-containing oxide layer 500 can be in a range from 3 nm to 20 nm, such as from 6 nm to 10 nm, although lesser and greater thicknesses can also be employed.

In one embodiment, the manganese-containing oxide layer 500 can consist essentially of manganese oxide which is made up of manganese and oxygen atoms with less than 1 at. % of atoms other than Mn and O. In another embodiment, the manganese-containing oxide layer 500 may include other atoms in a concentration above 1 at. % in addition to Mn and O. For example, silicon atoms from the silicon oxide materials of the first bonding-level silicon oxide layer 970 and the second bonding-level silicon oxide layer 770 can diffuse into the manganese material in the manganese layer 501 during conversion of the manganese layer 501 into the manganese-containing oxide layer 500. In this case, the oxidation process can incorporate silicon atoms into the manganese-containing oxide material such that the manganese-containing oxide material comprises manganese silicon oxide containing 2 to 25 at. %, such as 5 to 20 at. % silicon. In another embodiment, the manganese-containing oxide layer 500 may contain outer manganese silicon oxide regions adjacent to the first bonding-level silicon oxide layer 970 and the second bonding-level silicon oxide layer 770, and a middle region consisting essentially of manganese oxide having less than 1 at. % of atoms other than Mn and O, located between the outer manganese silicon oxide regions. In another embodiment, manganese-containing oxide layer 500 may contain additional atoms other than manganese, oxygen and optionally silicon, such as nitrogen, carbon and/or hydrogen atoms. For example, if layer 501 is deposited as manganese nitride and then oxidized to form the manganese-containing oxide layer 500, then layer 500 may also contain nitrogen.

The average atomic ratio of manganese atoms to silicon atoms in the manganese-containing oxide layer 500 can be in a range from 10,000:1 to 1:2 although lesser and greater ratios can also be employed. The average material composition of the manganese-containing oxide layer 500 can be $Mn_{1-x}Si_xO_2$, in which x is in a range from 0.0001 to 0.25. In one embodiment, the atomic concentration of the silicon atoms can have a vertical gradient within the manganese-containing oxide layer 500 (e.g., in the embodiment containing outer and inner regions), such that a minimum of the atomic concentration of silicon atoms occurs at the horizontal plane passing through the geometrical center of the manganese-containing oxide layer 500.

Without wishing to be bound by a particular theory, it is believed that the diffusion of oxygen atoms and silicon atoms across the interfaces between the manganese layer 501 and each of the first bonding-level silicon oxide layer 970 and the second bonding-level silicon oxide layer 770 may causes atomic level bonding of the manganese-containing oxide layer 500 to each of the first bonding-level silicon oxide layer 970 and the second bonding-level silicon oxide layer 770. Thus, the manganese-containing oxide layer 500 is bonded to the first dielectric material layers (290, 960, 970) and the second dielectric material layers (740, 760, 770). The first exemplary structure includes a bonded assembly containing a first semiconductor die 900, a second semiconductor die 700, and the manganese-containing oxide layer 500 therebetween.

Figure 5:
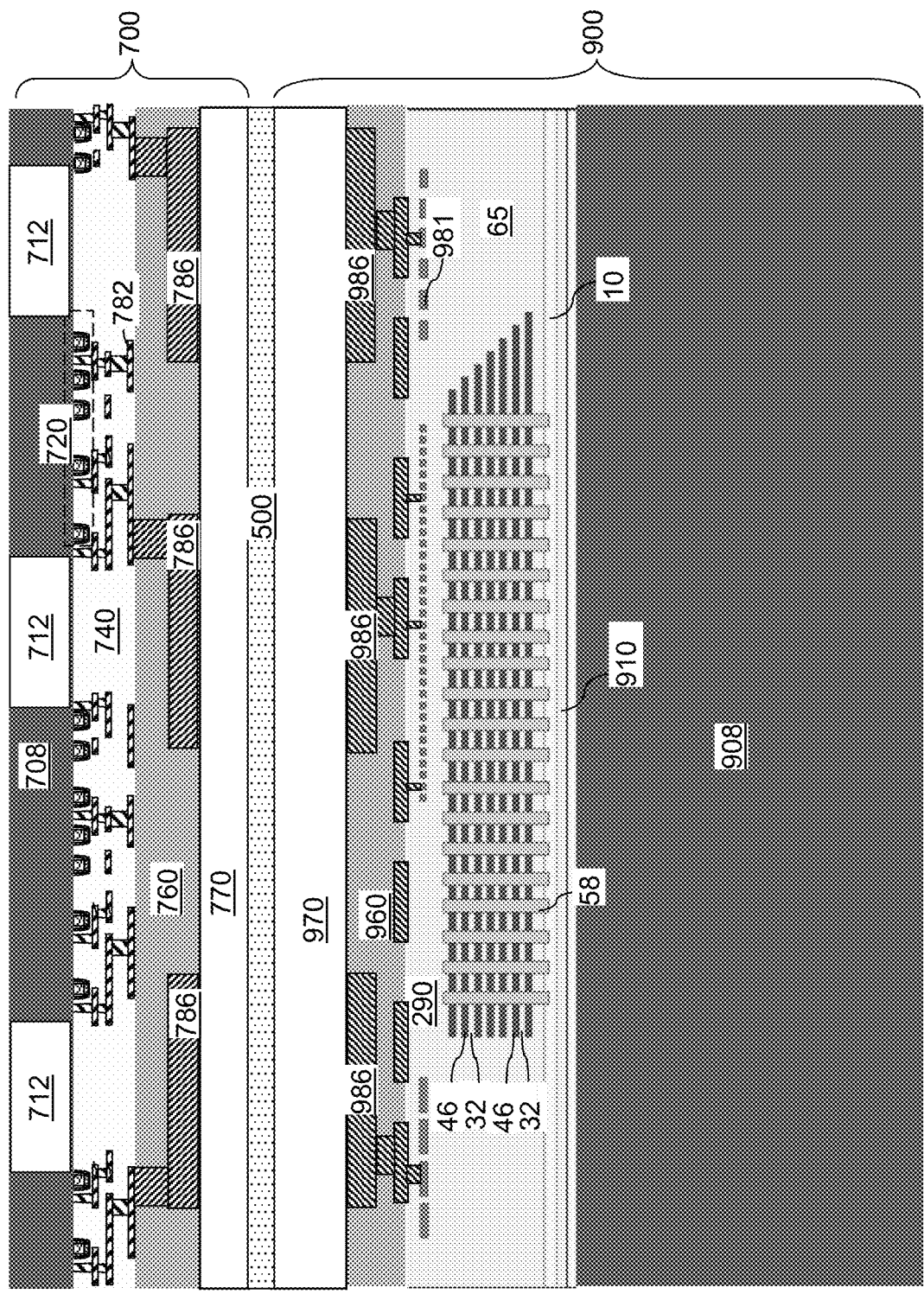
FIG. 5 is a schematic vertical cross-sectional view of the first exemplary structure after thinning the second semiconductor die according to the first embodiment of the present disclosure.

Referring to FIG. 5, one of the first substrate 908 and the second substrate 708 can be thinned. In the illustrated example, the second substrate 708 can be thinned, for example, by grinding, polishing, an isotropic etch process, or an anisotropic etch process such that the thickness of the second substrate 708 after thinning can be in a range from 0.5 micron to 3 microns, although lesser and greater thicknesses can also be employed. Backside surface of the substrate isolation dielectric structures 712 may be physically exposed after thinning. Optionally, a backside insulating layer (not shown) can be deposited on the thinned surface of the second substrate 708. The backside including layer includes a dielectric material, such as silicon oxide.

Figure 6:
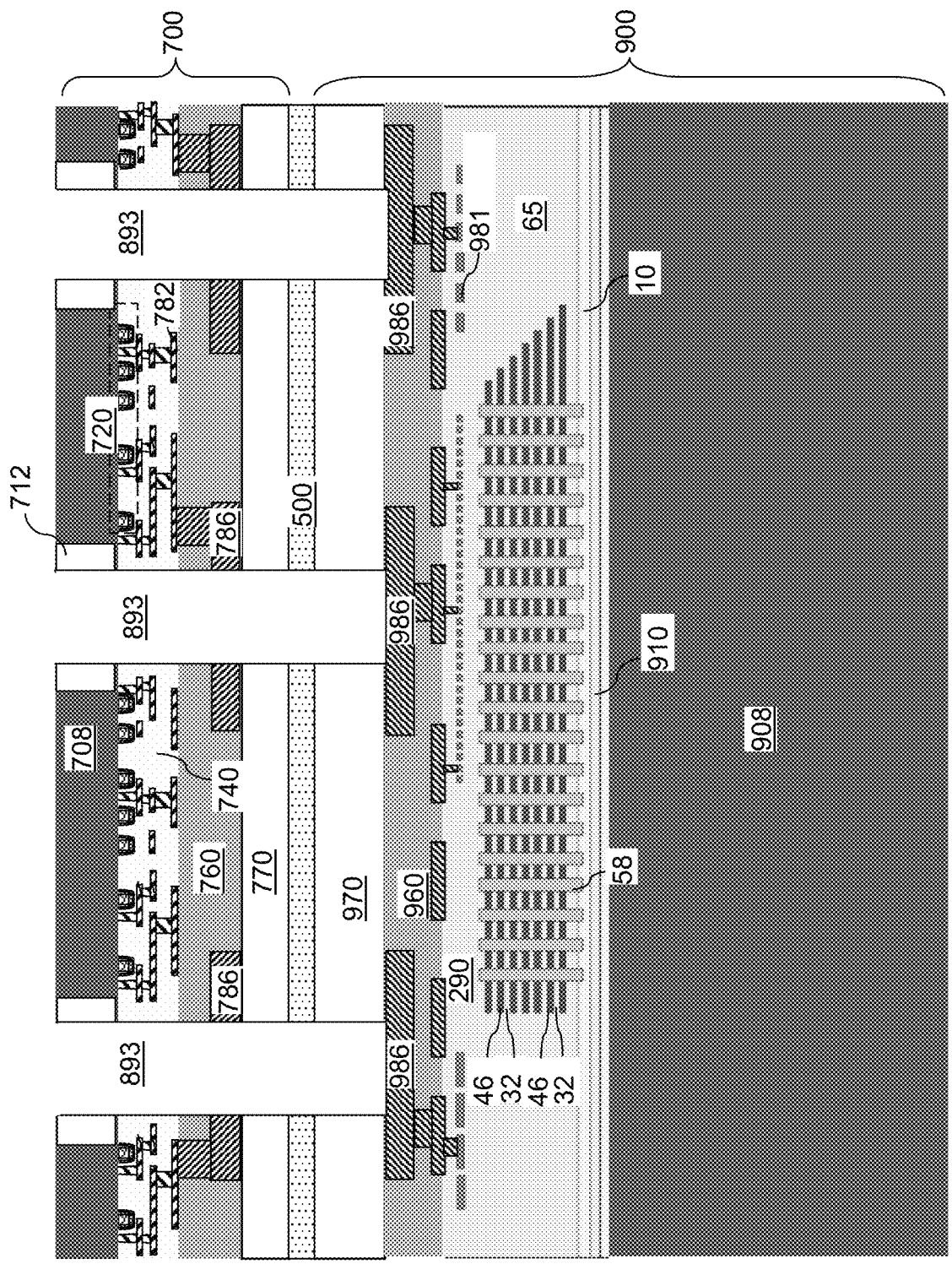
FIG. 6 is a schematic vertical cross-sectional view of the first exemplary structure after formation of through-substrate via cavities according to the first embodiment of the present disclosure.

Referring to FIG. 6, a photoresist layer (not shown) can be applied on the backside of the second substrate 708, and can be lithographically patterned to form opening therethrough. The location of the openings through the patterned photoresist layer can be selected such that each opening through the photoresist layer is located entirely within the area of a respective one of the first metallic pad structures 986 and the second metallic pad structures 786. In one embodiment, the pattern of the second metallic pad structures 786 can be a mirror image of the pattern of the first metallic pad structures 986. In this case, each opening through the photoresist layer is located entirely within an area of overlap between a respective pair of an overlying second metallic pad structure 786 and a underlying first metallic pad structure 986. In one embodiment, each opening through the photoresist layer can be formed entirety within an overlap area in which the areas of a substrate isolation dielectric structure 712, a second metallic pad structure 786, and a first metallic pad structure 986 overlap.

An anisotropic etch process can be performed using the patterned photoresist layer as an etch mask layer. The anisotropic etch process can etch through unmasked regions of the substrate isolation dielectric structures 712, the second dielectric material layers (740, 760, 770), the second metallic pad structures 786, and the first bonding-level silicon oxide layer 970, and can stop on proximal surfaces of the first metallic pad structures 986. The etch chemistries of the various steps of the anisotropic etch process can be selected to etch through the various unmasked material portions, and the terminal step of the anisotropic etch process can include an etch chemistry that anisotropically etches the silicon oxide material of the first bonding-level silicon oxide layer 970 selective to the metallic material of the first metallic pad structures 986.

Via cavities extending at least through the second substrate 708 and the first bonding-level silicon oxide layer 970 can be formed. The via cavities are herein referred to as through-substrate via cavities 893. Each of the through-substrate via cavities 893 can include a respective vertical or substantially vertical sidewall, and vertically extends from the backside surface of the second substrate 708 to a proximal surface of a respective one of the first metallic pad structures 986. Thus, a proximal surface of a first metallic pad structure 986 is physically exposed at the bottom of each through-substrate via cavity 893. A through-substrate via cavity 893 may extend through a second metallic pad structure 786. In this case, an annular sidewall of the second metallic pad structure 786 can be physically exposed to the through-substrate via cavity 893. Each through-substrate via cavity 893 can vertically extends through the entire thickness of the second semiconductor die 700, the manganese-containing oxide layer 500, and through all or a subset of the first dielectric material layers (290, 960, 970) which includes the first bonding-level silicon oxide layer 970. The photoresist layer can be subsequently removed, for example, by ashing.

Figure 7:
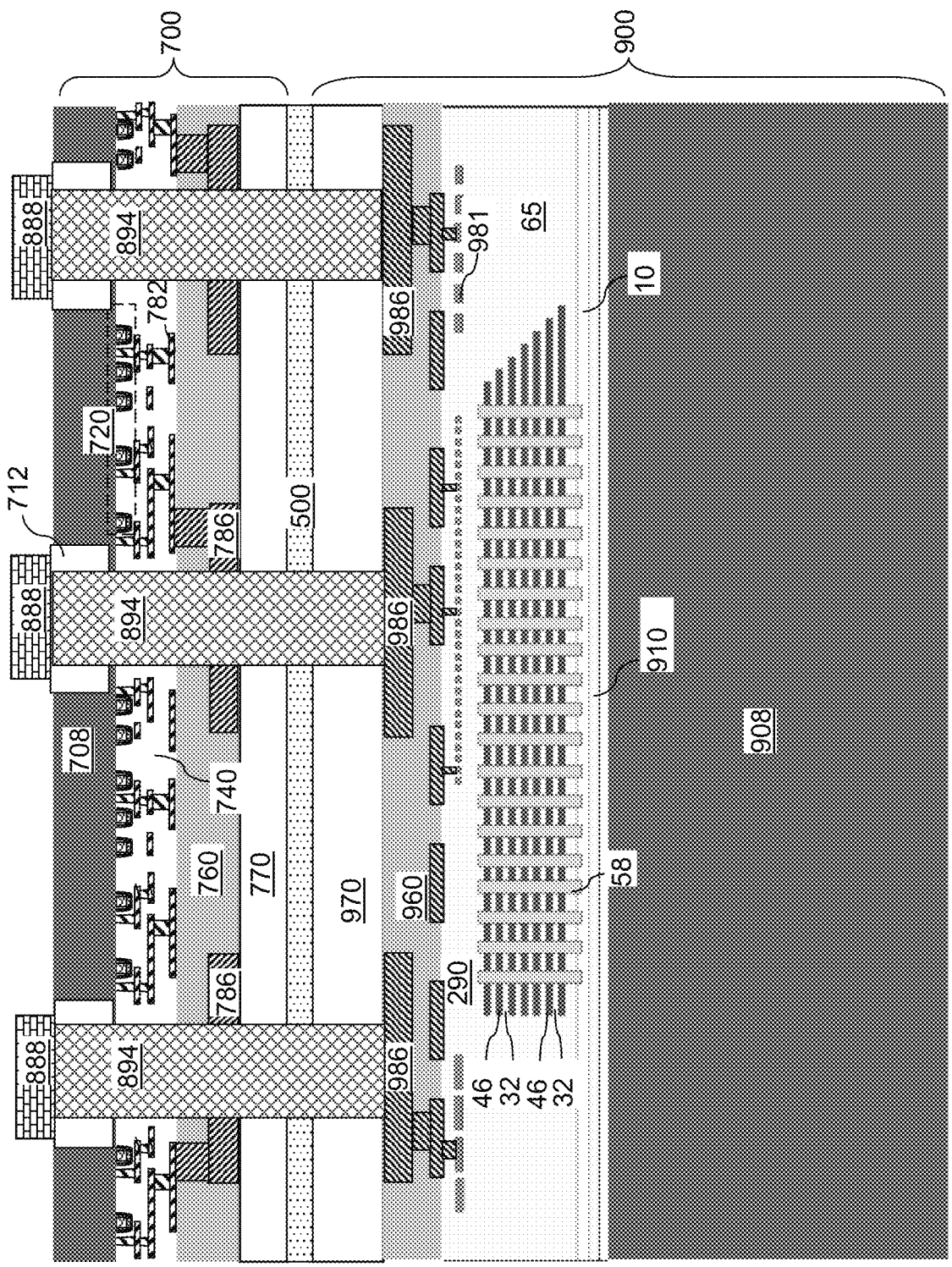
FIG. 7 is a schematic vertical cross-sectional view of the first exemplary structure after formation of through-substrate via structures and external bonding pads according to the first embodiment of the present disclosure.

Referring to FIG. 7, at least one conductive material such as at least one metallic material can be deposited in the through-substrate via cavities 893. The at least one conductive material can include, for example, a metallic nitride liner material such as TiN, TaN, and/or WN, and a metallic fill material such as W, Co, Cu, Ru, and/or Mo. The at least one conductive material can be deposited by physical vapor deposition or chemical vapor deposition. The at least one conductive material can be patterned into discrete portions to provide combinations of a through-substrate via structure 894 and an external bonding pad 888. Each portion of the at least one conductive material that fills a through-substrate via cavity 893 constitutes a through-substrate via structure 894, and each portion of the at least one conductive material that overlies the backside surface of the second substrate 708 constitutes an external bonding pad 888.

Each through-substrate via structure 894 that contacts a pair of a first metallic pad structure 986 and a second metallic pad structure 786 functions as a vertical electrically conductive path that provides electrical connection between a node in the first semiconductor die 900 and a node in the second semiconductor die 700. Thus, each vertical electrically conductive path between the first semiconductor die 900 and the second semiconductor die 700 can have a respective external bonding pad 888, which may, or may not, be connected to an external node. In one embodiment, a first subset of the external bonding pads 888 can be electrically connected to a respective external node, for example, through solder balls or bonding wires, and a second subset of the external bonding pads 888 may not be connected to any external bonding structure such as a solder ball or a bonding wire.

Figure 8:
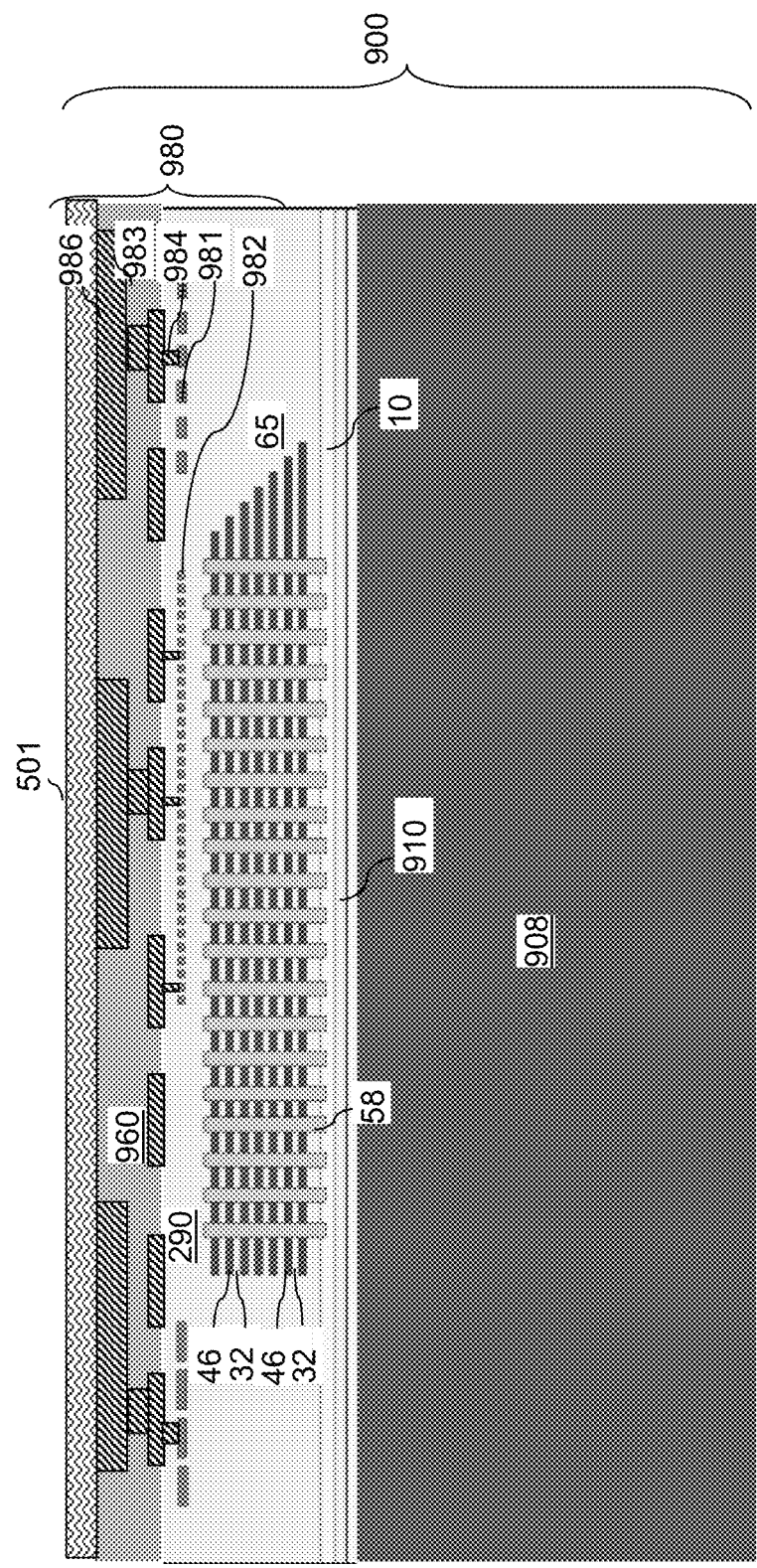
FIGS. 8, 9 and 10 area schematic vertical cross-sectional view of steps used to form a second exemplary structure of a second embodiment of the present disclosure.

In a second embodiment, the manganese-containing oxide layer 500 may be used to facilitate metal to dielectric bonding rather than dielectric to dielectric bonding of the first embodiment. Referring to FIG. 8, a first semiconductor die 900 for forming a second exemplary structure according to a second embodiment of the present disclosure is illustrated. The first semiconductor die 900 of FIG. 8 is the same as the first semiconductor die 900 of FIG. 1, except that the first bonding-level silicon oxide layer 970 is omitted and the first metallic pad structures 986 are exposed at the surface of the first dielectric material layers.

In the second embodiment, the manganese layer 501 is formed directly on the first metallic pad structures 986 and the dielectric layer 960. The first metallic pad structures 986 may comprise any suitable metal, such as copper or copper alloy. The manganese layer 501 forms a metal to metal bond with the first metallic pad structures 986 during and/or after deposition.

Figure 9:
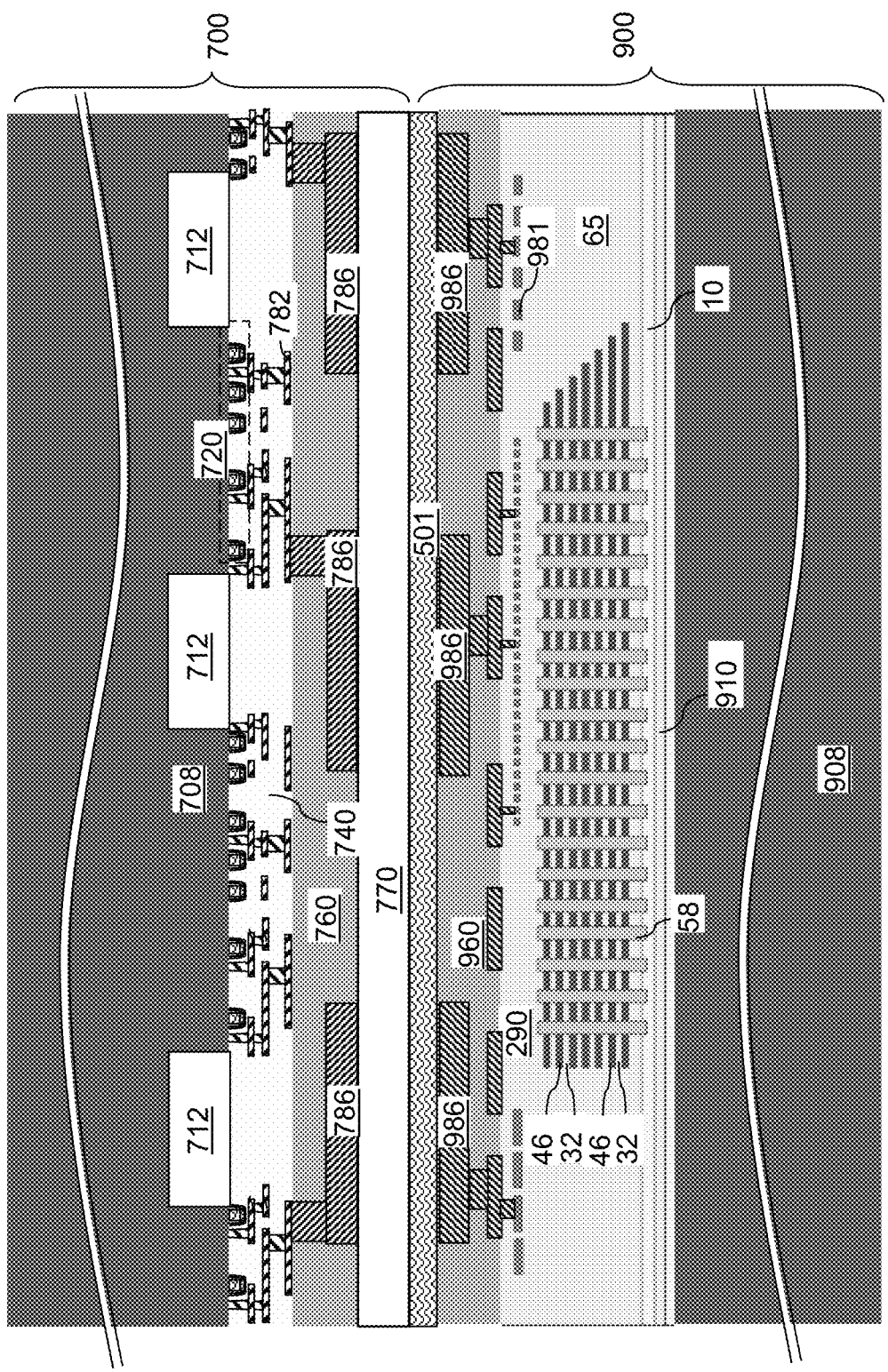

As shown in FIG. 9, the steps of FIGS. 2 and 3 of the first embodiment are performed to position the second semiconductor die 700 on the manganese layer 501.

Figure 10:
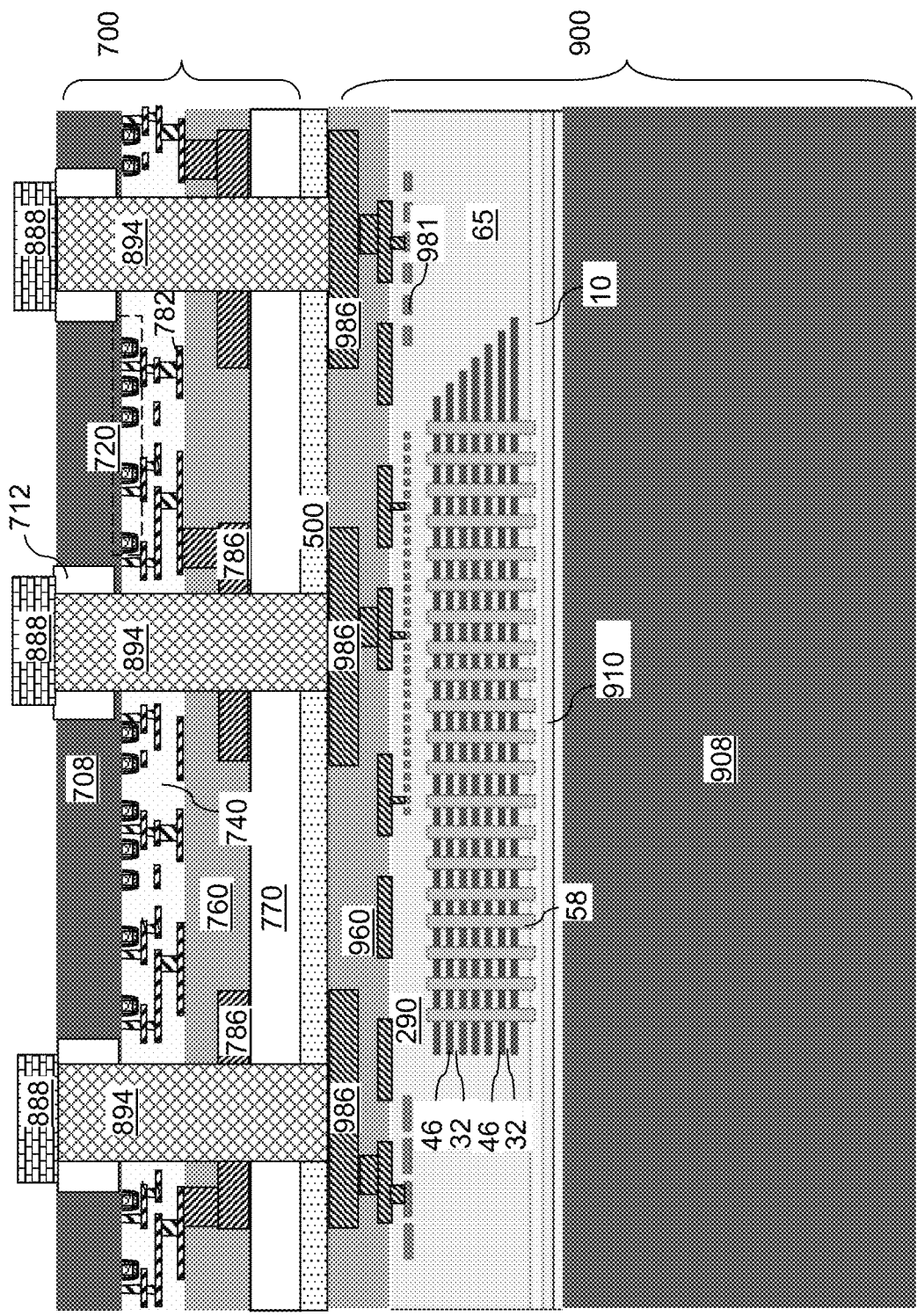

As shown in FIG. 10, the steps of FIGS. 4 through 7 of the first embodiment are performed to convert the manganese layer 501 to the manganese-containing oxide layer 500 during the bonding of the first semiconductor die 900 to the second semiconductor die 700, and to form the through-substrate via structures 894 that each contacts a pair of a first metallic pad structure 986 and a second metallic pad structure 786.

During the bonding anneal, oxygen and optionally silicon atoms diffuse from the second bonding-level silicon oxide layer 770 into the manganese layer 501 to oxidize and convert the manganese layer 501 to the manganese-containing oxide layer 500. Furthermore, if the manganese layer 501 contacts any portion of the silicon oxide layer 960, then oxygen and optionally silicon atoms also diffuse from the silicon oxide layer 960 into the manganese layer 501 to further oxidize and convert the manganese layer 501 to the manganese-containing oxide layer 500. Therefore, in this embodiment, the manganese-containing oxide layer 500 provides a metal to dielectric bond between and the first metallic pad structures 986 and the second bonding-level silicon oxide layer 770.

In an alternative aspect of the second embodiment, the second bonding-level silicon oxide layer 770 is omitted instead of the first bonding-level silicon oxide layer 970. In this aspect, the manganese layer 501 is formed on the exposed second metallic pad structures 786 and optionally on the silicon oxide layer 760 of the second semiconductor die 700. The manganese layer 501 is brought into contact with the first bonding-level silicon oxide layer 970 during bonding of the first and second semiconductor die, and is then converted to the manganese-containing oxide layer 500 during the bonding anneal. Therefore, in this aspect of the second embodiment, the manganese-containing oxide layer 500 provides a metal to dielectric bond between and the second metallic pad structures 786 and the first bonding-level silicon oxide layer 970.

Figure 11:
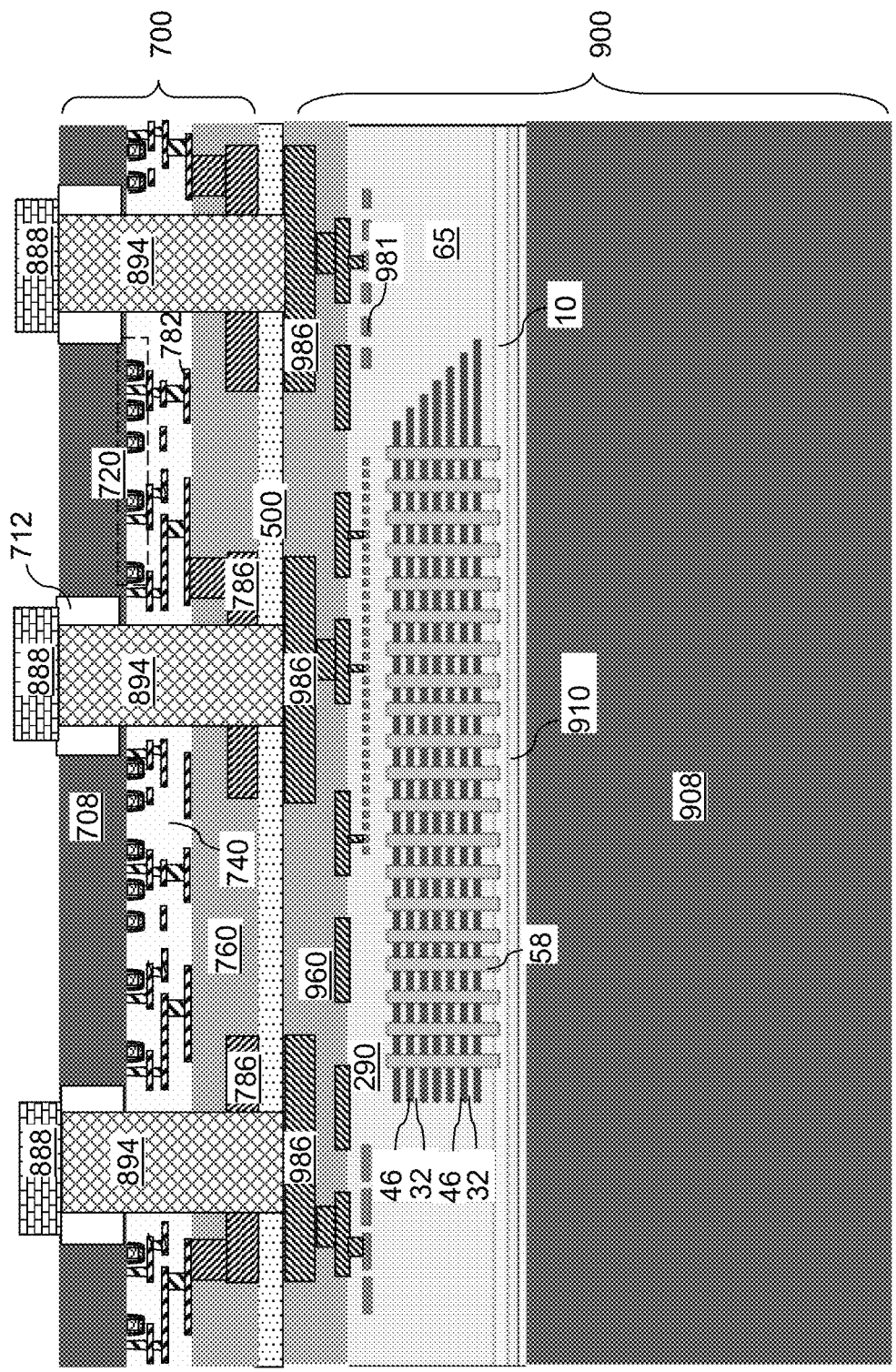
FIG. 11 is a schematic vertical cross-sectional view of the third exemplary structure after formation of through-substrate via structures and external bonding pads according to the third embodiment of the present disclosure.

FIG. 11 is a schematic vertical cross-sectional view of the third exemplary structure after formation of through-substrate via structures and external bonding pads according to the third embodiment of the present disclosure. In the third embodiment, the second bonding-level silicon oxide layer 770 is omitted at the processing step shown in FIG. 9. Thus, as shown in FIG. 11, the manganese-containing oxide layer 500 contacts both the first interconnect-level dielectric layer(s) 960 and the distal interconnect-level dielectric layer(s) 760. Otherwise, the device and method of the third embodiment are the same as that of the second embodiment.

Referring to all drawings and according to various embodiments of the present disclosure, a bonded assembly is provided, which comprises: a first semiconductor die 900 comprising a first substrate 908, first semiconductor devices 920 overlying the first substrate 908, first dielectric material layers (290, 960, 970) overlying the first semiconductor devices, and first metal interconnect structures 980 embedded in the first dielectric material layers; a second semiconductor die 700 overlying the first semiconductor die 900, and comprising a second substrate 708, second semiconductor devices 720 overlying the second substrate 708, second dielectric material layers (740, 760, 770) overlying the second semiconductor devices 720, and second metal interconnect structures 780 embedded in the second dielectric material layers; and a manganese-containing oxide layer 500 contacting a top surface of the first dielectric material layers (290, 960, 970) and a bottom surface of the second dielectric material layers (740, 760, 770).

As used herein, the term "overlying" means located over one surface of another component without respect for the direction of gravity because the bonded assembly may be positioned at any angle with regard to the direction of gravity. Thus, since the first and second dielectric material layers face each other in the bonded assembly, they "overly" each respective first and second substrate, irrespective of whether one of the substrates is located closer to the ground that the other substrate.

In one embodiment, a topmost layer of the first dielectric material layers (290, 960, 970) comprises a first bonding-level silicon oxide layer 970 which forms the top surface of the first dielectric material layers, and a bottommost layer of the second dielectric material layers (740, 760, 770) comprises a second bonding-level silicon oxide layer 770 which forms the bottom of the second dielectric material layers.

In one embodiment, the manganese-containing oxide layer 500 comprises: a first surface portion including a first manganese silicon oxide material and contacting the first bonding-level silicon oxide layer 970; and a second surface portion including a second manganese silicon oxide material and contacting the second bonding-level silicon oxide layer 770. Depending on the degree of silicon diffusion into the manganese-containing oxide layer 500, the portion of the manganese-containing oxide layer 500 located between the first surface portion and the second surface portion may consist essentially of manganese oxide, or may include an intermediate manganese silicon oxide material. The intermediate manganese silicon oxide material may have the same atomic concentration of silicon atoms as the first surface portion and the second surface portion, or may have a lower atomic concentration of silicon atoms than the first surface portion and the second surface portion.

In one embodiment, an atomic concentration of silicon atoms in the manganese-containing oxide layer 500 has a vertical gradient between an interface with the first bonding-level silicon oxide layer 970 and an interface with the second bonding-level silicon oxide layer 770.

In one embodiment the manganese-containing oxide layer 500 comprises a first outer manganese silicon oxide region located adjacent to the first bonding-level silicon oxide layer 970, a second outer manganese silicon oxide region located adjacent to the second bonding-level silicon oxide layer 770, and middle region consisting essentially of manganese oxide having less than 1 atomic percent of atoms other than Mn and O located between the first and the second outer manganese silicon oxide regions.

In another embodiment, the manganese-containing oxide layer 500 consists essentially of manganese atoms, oxygen atoms, and silicon atoms, and the first and the second bonding-level silicon oxide layers (970, 770) comprise silicon dioxide or SiOCH. In one embodiment, an atomic percentage of manganese atoms within the manganese-containing oxide layer 500 is at least 30%.

In one embodiment, the manganese-containing oxide layer 500 also contacts a top surface of the first metal interconnect structures 980 in addition to contacting the top surface of the first dielectric material layers.

In one embodiment, a through-substrate via structure 894 vertically extends through the second semiconductor die 700, the manganese-containing oxide layer 500, and a subset of the first dielectric material layers (290, 960, 970) and contacts a respective first metal interconnect structure 980 embedded within the first dielectric material layers (290, 960, 970). In one embodiment, the through-substrate via structure 894 contacts the manganese-containing oxide layer 500.

In one embodiment, the first semiconductor die 900 comprises a memory die, the first semiconductor devices 920 comprise three-dimensional memory devices which overly the first substrate, the second semiconductor die 700 comprises a logic die, and the second semiconductor devices 720 comprise peripheral devices for operation of the three-dimensional memory devices of the memory die.

The various embodiments of the present disclosure provide a bonded assembly of semiconductor dies containing a manganese-containing oxide layer 500 that is formed by oxidation of a manganese layer 501. The manganese layer 501 is highly reactive and readily forms manganese oxide. Silicon atoms from adjoining silicon oxide layers can diffuse into the manganese-containing oxide layer 500 to strengthen the bonding between a pair of semiconductor dies. The methods of the embodiments of the present disclosure provide a low cost method for providing high strength bonding between a pair of semiconductor dies.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
    a first semiconductor die comprising a first substrate, first semiconductor devices overlying the first substrate, first dielectric material layers overlying the first semiconductor devices, and first metal interconnect structures embedded in the first dielectric material layers and comprising a first metallic pad structure;
    a second semiconductor die overlying the first semiconductor die, and comprising a second substrate, second semiconductor devices overlying the second substrate, second dielectric material layers overlying the second semiconductor devices, and second metal interconnect structures embedded in the second dielectric material layers and comprising a second metallic pad structure;
    a manganese-containing oxide layer directly contacting a top surface of the first dielectric material layers and directly contacting a bottom surface of the second dielectric material layers;
    a through-substrate via cavity which vertically extends from a backside surface of the second substrate to a proximal surface of the first metallic pad structure through the second metallic pad structure and through the manganese-containing oxide layer, such that an annular sidewall of the second metallic pad structure is physically exposed to the through-substrate via cavity; and
    a through-substrate via structure located in the through-substrate via cavity, vertically extending through the second semiconductor die, through the second metallic pad structure and through the manganese-containing oxide layer, and contacting the proximal surface of the first metallic pad structure, wherein a sidewall of the through-substrate via structure contacts the annular sidewall of the second metallic pad structure.

2. The bonded assembly of claim 1, wherein:
    a topmost layer of the first dielectric material layers comprises a first bonding-level silicon oxide layer which forms a top surface of the first dielectric material layers; and
    a bottommost layer of the second dielectric material layers comprises a second bonding-level silicon oxide layer which forms the bottom surface of the dielectric material layers.

3. The bonded assembly of claim 2, wherein the manganese-containing oxide layer comprises:
    a first surface portion including a first manganese silicon oxide material and contacting the first bonding-level silicon oxide layer; and
    a second surface portion including a second manganese silicon oxide material and contacting the second bonding-level silicon oxide layer.

4. The bonded assembly of claim 3, wherein an atomic concentration of silicon atoms in the manganese-containing oxide layer has a vertical gradient between an interface with the first bonding-level silicon oxide layer and an interface with the second bonding-level silicon oxide layer.

5. The bonded assembly of claim 3, wherein:
    the manganese-containing oxide layer consists essentially of manganese atoms, oxygen atoms, and silicon atoms; and
    the first and the second bonding-level silicon oxide layers comprise silicon dioxide or SiOCH.

6. The bonded assembly of claim 5, wherein an atomic percentage of the manganese atoms within the manganese-containing oxide layer is at least 30%.

7. The bonded assembly of claim 1, wherein the manganese-containing oxide layer also contacts a top surface of the first metal interconnect structures in addition to contacting the top surface of the first dielectric material layers.

8. The bonded assembly of claim 1, wherein:
the first semiconductor die comprises a memory die;
the first semiconductor devices comprise three-dimensional memory devices which overly the first substrate;
the second semiconductor die comprises a logic die; and
the second semiconductor devices comprise peripheral devices for operation of the three-dimensional memory devices of the memory die.

9. The bonded assembly of claim 1, wherein:
the through-substrate via structure comprises a portion that vertically extends between the second metallic pad structure and the proximal surface of the first metallic pad structure; and
an entirety of the sidewall of the portion of the through-substrate via structure that vertically extends between the second metallic pad structure and the proximal surface of the first metallic pad structure is located within a same vertical plane as a vertical plane of the annular sidewall of the second metallic pad structure.

10. The bonded assembly of claim 1, wherein:
the through-substrate via structure contacts the second metallic pad structure only at the annular sidewall; and
the through-substrate via structure does not contact any horizontal surface of the second metallic pad structure.

11. The bonded assembly of claim 1, wherein the first metallic pad structure is vertically spaced from the second metallic pad structure by the manganese-containing oxide layer and at least one silicon oxide layer that is a component of the first dielectric material layers or the second dielectric material layers.

12. The bonded assembly of claim 1, wherein the sidewall of the through-substrate via structure is a straight sidewall that vertically extends straight from the backside surface of the second substrate, through the second substrate, through the second dielectric material layers, through the annular sidewall of the second metallic pad structure and through the manganese-containing oxide layer to the proximal surface of the first metallic pad structure.

13. The bonded assembly of claim 1, wherein the annular sidewall of the second metallic pad structure surrounds the through-substrate via structure.

* * * * *